FABRICATION OF SINGLE-CRYSTAL FILM SEMICONDUCTOR DEVICES

Filed June 12, 1969

INVENTORS
DONALD B. SANDSTROM
DAVID E. SAWYER
BY [signature]
ATTORNEYS

1

3,621,565
FABRICATION OF SINGLE-CRYSTAL FILM SEMICONDUCTOR DEVICES

Donald B. Sandstrom, Gleasondale, and David E. Sawyer, Newton Centre, Mass., assignors to the United States of America as represented by the Administrator of the National Aeronautics and Space Administration Filed June 12, 1969, Ser. No. 832,603
Int. Cl. B01j *17/00;* H01l *7/24*
U.S. Cl. 29—590 4 Claims

ABSTRACT OF THE DISCLOSURE

The fabrication of devices wherein a single-crystal film is formed on a growth substrate, device fabrication operations are performed on the exposed surface of the film and the film thereafter transferred to a nonconductive base. The transfer step includes dissolution of the growth substrate and may be followed by additional device fabrication operations performed on the second side of the film.

ORIGIN OF THE INVENTION

The invention described herein was made by employees of the United States Government and may be manufactured and used by or for the Government for governmental purposes without the payment of any royalties thereon or therefor.

BACKGROUND OF THE INVENTION

(1) Field of the invention

The present invention relates to semiconductor devices. More specifically, the present invention is directed to the fabrication of thin film semiconductor devices. Accordingly, the general objects of the present invention are to provide novel and improved methods and apparatus of such character.

(2) Description of the prior art

Semiconductor devices have previously been made in thin and thick film form. Typically, prior art fabrication techniques for such semiconductor devices have employed the vacuum deposition of the semiconductor material onto an insulator. Vacuum deposition, as well as a majority of the other prior techniques, yields a polycrystalline semiconductor film. In order to obtain the long-range atomic ordering characteristics of single-crystal perfection necessary for high quality optical and electrical device fabrication, various expedients have been attempted. Thus, for example, attempts have been made to obtain the deposition of single-crystal material by depositing a film of semiconductor material upon a heated substrate. The various prior art expedients have not, however, resulted in the deposition of material having characteristics approaching those predicted for single-crystal material and obtainable in bulk semiconductor material.

SUMMARY OF THE INVENTION

The present invention overcomes the foregoing and other disadvantages of the prior art by providing a novel technique for the fabrication of single-crystal semiconductors and semiconductor devices in film form with optical and electrical characteristics superior to those made using prior art techniques. In accordance with the present invention, a single-crystal film of the desired semiconductor material is formed on a growth substrate comprised of an expendable single crystalline material. After formation of the single-crystal film, the operations required to produce the desired device such as, for example, diffusions, formation of ohmic contacts, etc.; are performed. The exposed surface of the single-crystal film is thereafter affixed to a rigid insulating support and the growth substrate removed. Removal of the growth substrate will be accomplished by chemical etching. Finally, if necessary or desired, additional device operations may be performed on the previously inaccessible side of the single-crystal film. The performance of subsequent device operations permits the fabrication of devices considerably more complex in nature than those previously obtainable.

2

BRIEF DESCRIPTION OF THE DRAWING

The present invention may be better understood and its numerous objects and advantages will become apparent to those skilled in the art by reference to the accompanying drawing wherein like reference numerals refer to like elements in the various figures and in which.

DESCRIPTION OF THE PREFERRED EMBODIMENT

Figure 1A:
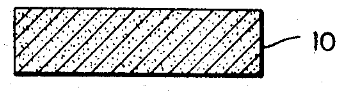
FIGS. 1A–1E depict, in cross-sectional side elevation, the stages of fabrication of a semiconductor device in accordance with the present invention.

In accordance with the present invention as shown in FIG. 1A, a growth substrate 10 is first selected or prepared. Growth substrate 10 is comprised of a single crystalline material which may either be grown by conventional methods or which may be a naturally occurring material. For the purposes to be described below, the requirements of the growth substrate are that it be compatible with the formation of a single crystalline film thereon and that it be capable of being readily removed in the manner and for the purposes to be described below.

Figure 1B:
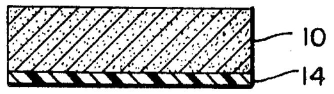
Figure 1C:
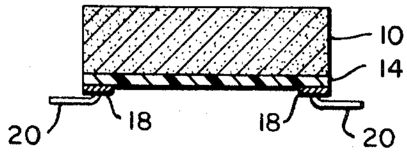
Figure 2:
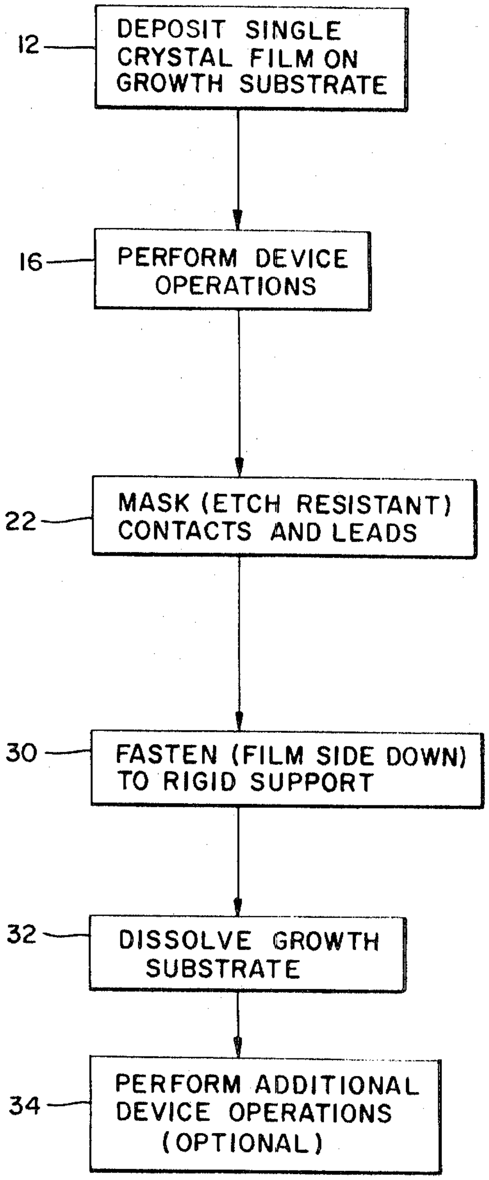
FIG. 2 is a flow diagram representing the various operations which are performed in accordance with the present invention.

In accordance with the present invention, as indicated at step 12 in FIG. 2, a single-crystal film is formed on substrate 10 as a first step in practice of the present invention. Since the film, which is indicated at 14 in FIG. 1B, is grown epitaxially, substrate 10 must itself be a single-crystal material, although not necessarily the same material as the film, in order that the deposited film-forming material will take on the characteristics of the single crystalline substrate.

The epitaxial growth of the single-crystal film 14 in step 12 may be accomplished by any of several conventional methods. For example, film 14 may be produced through the utillization of vapor deposition, sputtering or evaporation techniques.

Subsequent to the growing of epitaxial layer or film 14 on substrate 10, as indicated at step 16 in FIG. 2, device operations are performed on film 14 to produce the desired semiconductor devices. In the context of the present invention, a device operation may comprise, for example, single or multi-step diffusions, through the use of conventional photo fabrication techniques, to impart the desired conductivity characteristics to various areas of the film 14 and the formation of ohmic contacts to the film. The contacts may, for example, be formed by alloying techniques known in the art to produce nonpenetrating ohmic contacts 18 to which may be soldered gold wires 20. It is to be noted that the film and growth substrate may be separated into a plurality of individual "devices" by a technique such as string sawing either prior or subsequent to step 16.

Figure 1D:
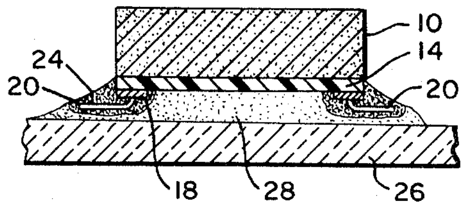

After the desired fabrication operations, such as diffusion and/or contact alloying steps, have been completed, the contacts and leads are completely masked in step 22 so that they will not be contacted by the etchant employed in the steps to be described below. This insulating coating is indicated on the leads in FIG. 1D at 24.

After the leads and contacts have been suitably insulated, the film 14 and its growth substrate 10 are fastened, film side down, to a rigid support 26. Support 26 is comprised of an etch resistant, insulating material, typically a ceramic. The attachment of the film to the support 26 is accomplished by means of an etch resistant, nonconductive material which will adhere to the surfaces of both elements. This fastening material must also be inert whereby migration of impurities therefrom into epitaxial layer 14 will not occur. The fastening material may, for example, comprise a low melting point wax such as indicated at 28 in FIG. 1D. The fastening of the film and growth substrate to the support 26 is indicated at step 30 and the choice of the support material for use in step 30 is dictated by the need for an insulating material which will provide sufficient physical strength and rigidity for layer 14 after removal of the growth substrate. In order to guard against fracture of layer 14, it is also desirable that support 26 have a coefficient of thermal expansion compatible with that of the epitaxial film.

Figure 1E:
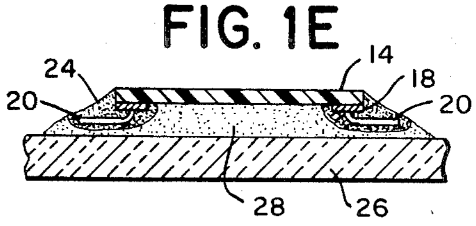

The next step in accordance with the present invention, as indicated at 32, consists of the removal of the growth substrate 10. As previously indicated, growth substrate 10 is comprised of an expendable material which, accordingly, can be dissolved without rendering the process economically unfeasible. Removal of growth substrate 10 is typically accomplished by immersing the entire assembly, including support 26, in a suitable etchant. Etching will proceed, usually with the aid of agitation, until growth substrate 10 is completely dissolved thereby producing the structure shown in cross section in FIG. 1E. The etchants which will dissolve the growth substrate do not dissolve the epitaxial film 14 at a significant rate. Accordingly, close control over step 32 is not necessary. Tests have indicated that the etching action is, at least in part, electrolytic in nature and, accordingly, the film 14 will be etched through in the vicinity of the contacts 18 unless the contacts and leads are completely insulated from the etchant.

Once growth substrate 10 has been completely dissolved, the previously unavailable side of film 14 will be exposed. Accordingly, if necessary or desirable, additional fabrication operations may be performed on the single-crystal film, as indicated at step 34, in order to complete the semiconductor devices. It is especially to be noted that the technique of the present invention whereby device fabrication operations may be performed at two points in the manufacturing procedure, that is at steps 16 and 34, permits the production of more intricate devices than previously obtainable. In some cases, in order to perform operation 34, it will be necessary to remove the fastening agent 28. For example, if operation 34 is a diffusion step performed at, for example, 700° C. and material 28 is a wax, the wax must be removed to obviate the possibility of spoiling the diffusion operation.

In a typical example, a 10 micron epitaxial layer of n-type $InAs_{0.438}P_{0.562}$ was grown on a growth substrate comprising a wafer of single-crystal indium arsenide having a thickness of approximately 300 microns. The film was grown employing a conventional vapor-transport process. The orderly atomic pattern of the InAs substrate served as a pattern for the orderly (single-crystal) growth of the epitaxial layer. Subsequent to growing the single-crystal thin film, the InAs wafer (substrate plus film) was diced by means of string sawing with a 10 mil diamond impregnated wire. During dicing, glycerol-water lubrication, but no cutting slurry, was used. Thereafter, essentially nonpenetrating ohmic contacts were made to the single-crystal film by allowing 10 mil dots of indium, 1% tin at approximately 510° C. Small gold wires were then soldered to the dots and the contacts and wires were insulated by being thoroughly covered with a low melting temperature wax. The commercially available product known as "Apiezon W" wax has been successfully used both in insulating the leads and in attaching the wafers, film side down, to ceramic plates which function as the rigid supports.

In order to remove the InAs growth substrate, the assemblies have been immersed in a 2HF, $6HNO_3$ and $1H_2O$ solution and the solution agitated. Etching has been allowed to proceed in stepwise fashion in intervals of from 30–60 seconds with the devices being examined between steps so as to monitor the degree of dissolution of the growth substrate. Upon complete dissolution of the growth substrate, etching is self-terminating and the previously protected surface of the single-crystal film was exposed and available for further device operations.

Prior to performing any such further device operations, visual observation and measurement of conductivity between leads verify that the film bonded to the ceramic base is continuous. Also, photoconductivity measurements verify that the substrate is removed completely. The measuring apparatus consisted of a lock-in amplifier, and a monochromator and incandescent lamp calibrated in terms of relative photon flux incident on the substrate side of the sample. The photoconductivity peaked at about 1.4 microns. Since the photoconductivity peaks well below 3.5 microns (the peak response for 100% InAs), it is evident that the substrate is completely removed leaving the epitaxial film. Also, the response peak at 1.4 microns is about what is expected for material with the bandgap corresponding to the composition of the epitaxial layer. It should be noted that samples produced as indicated above, and without further device operations, have potential utility as thin-film optical detectors.

It is to be noted that, due to the fragile nature of the single-crystal films, there is a tendency for such films to fracture after bonding of the wafers to the rigid support. This tendency to fracture is apparently due to stresses generated with the cooling of the wax (agent 28), the stresses being relieved by fracturing of the film upon removal of the growth substrate. If fracturing of the single crystal film becomes a problem, it may be substantially eliminated by "aging" the wax prior to fastening the wafer, film side down, to the rigid support. Thus, considering again the example described above, the "Apiezon W" wax will typically be melted onto the ceramic plate, the temperature raised to approximately 400° F. and the temperature thereafter reduced to 300° F. at which time the single-crystal film is brought into contact with the wax and the entire structure allowed to cool to room temperature.

While a preferred embodiment has been shown and described, various modifications and substitutions may be made thereto without departing from the spirit and scope of the present invention.

What is claimed is:

1. The process of fabricating a single-crystal thin-film semiconductor device which comprises:

epitaxially depositing a single-crystal thin film of semiconductor material on a single-crystal substrate;

performing on the exposed surface of said single-crystal thin film, supported on said substrate, some of the operations required to transform said thin film into the desired device, including attaching at least one lead to a selected part of said thin film;

fastening said exposed surface of said thin film and said at least one lead to a rigid support with an insulating adhesive;

removing said single-crystal substrate from said thin film, thereby exposing the other surface of said thin film; and performing on said other surface of said thin film the remaining operations required to transform said thin film into the desired device.

2. The method set forth in claim 1, wherein said insulating adhesive is a wax and wherein said fastening step comprises:

applying said wax to said rigid support;

heating said support and wax to a first temperature substantially higher than the melting point of said wax;

reducing said heating to a second temperature only slightly higher than said melting point;

placing said exposed surface of said thin film and said at least one lead in said wax at said second temperature and thereafter allowing the assembly to cool to room temperature.

3. The method set forth in claim 2, wherein said wax is "Apiezon W" and said first and second temperatures are 400° and 300° F., respectively.

4. The method set forth in claim 2, wherein said support is etch-resistant and wherein said removing step comprises:

immersing said waxed assembly in an etchant, which dissolves said single-crystal substrate faster than said thin film, until said substrate is completely dissolved.

References Cited

UNITED STATES PATENTS

| | | | |
|---|---|---|---|
| 3,531,857 | 10/1970 | Iwamatsu | 29—576 |
| 3,261,727 | 7/1966 | Dehmelt et al. | 29—576 |
| 3,429,756 | 2/1969 | Groves | 156—17 |

JOHN F. CAMPBELL, Primary Examiner

W. TUPMAN, Assistant Examiner

U.S. Cl. X.R.

156—17, 320